United States Patent [19]
Sato et al.
[11] 3,786,375
[45] Jan. 15, 1974

[54] PACKAGE FOR MOUNTING SEMICONDUCTOR DEVICE IN MICROSTRIP LINE

[75] Inventors: Hitoshi Sato, Tokyo; Mitsuo Tanaka; Michiharu Nakamura, both of Hachioji-shi; Susumu Takahashi, Kokubunji-shi; Hirokazu Kurono, Hachioji-shi, all of Japan

[73] Assignee: Hitachi, Ltd., Tokyo, Japan

[22] Filed: Apr. 26, 1971

[21] Appl. No.: 137,479

[30] Foreign Application Priority Data

Apr. 27, 1970 Japan ................................ 45/35413

[52] U.S. Cl. ......... 333/84 M, 333/97 R, 174/DIG. 3
[51] Int. Cl. ............................ H01p 3/08, H05k 1/08
[58] Field of Search ............. 333/84 M, 84 R, 97 R; 174/DIG. 3; 317/234 F, 234 G, 234 A, 101CP; 29/591

[56] References Cited

UNITED STATES PATENTS

| | | | |
|---|---|---|---|
| 3,577,181 | 4/1971 | Belohoubeic | 333/84 M |
| 3,651,434 | 3/1972 | McGeough | 333/84 M |
| 3,628,105 | 12/1971 | Sakai et al. | 174/DIG. 3 |
| 3,404,214 | 10/1968 | Elliott | 317/101 CP |
| 3,290,564 | 12/1966 | Wolff, Jr. | 317/234 A |
| 2,710,946 | 6/1955 | Grieg et al. | 333/84 M X |
| 2,867,782 | 1/1959 | Arditi | 333/84 M X |
| 3,008,089 | 11/1961 | Uhlir, Jr. | 333/84 M X |
| 3,187,240 | 6/1965 | Clark | 317/234 G |
| 3,271,507 | 9/1966 | Elliott | 317/101 CP X |
| 3,283,224 | 11/1966 | Erkan | 317/234 A |
| 3,417,294 | 12/1968 | Steidlitz | 333/84 X |
| 3,436,604 | 4/1969 | Hyltin et al. | 317/101 CP |
| 3,500,428 | 3/1970 | Allen | 333/84 |
| 3,534,299 | 10/1970 | Eberhardt | 333/84 M X |
| 3,554,821 | 1/1971 | Caulton et al. | 317/234 G |

FOREIGN PATENTS OR APPLICATIONS

| | | | |
|---|---|---|---|
| 1,181,459 | 2/1970 | Great Britain | 317/234 G |

OTHER PUBLICATIONS

Cuccia, C.L.; "Lownoise Microwave Transistors", Microwave Jr., 2-1968, pp. 77, 80-81

Alpha, "Integrated Semiconductor Modules", Alpha Industries, Inc., Catalog, D-68 from Microwave Jr. 5-1968, pp. 2.

*Primary Examiner*—Rudolph V. Rolinec
*Assistant Examiner*—Wm. H. Punter
*Attorney*—Craig, Antonelli & Hill

[57] ABSTRACT

In a microstrip line, a package for mounting a required semiconductor device between a pair of blocks of dielectric material disposed on a first conductive plate to be spaced apart a predetermined distance from each other in the longitudinally extending direction of the first conductive plate. The package is provided with electrical leads on its upper surface for establishing an electrical connection between second conductive plates disposed on the upper surface of the dielectric blocks opposite to the first conductive plate.

12 Claims, 5 Drawing Figures

INVENTORS

HITOSHI SATO, MITSUO TANAKA,

MICHIHARU NAKAMURA, SUSUMU TAKAHASHI and

HIROKAZU KURONO

BY Craig, Antonelli & Hill

ATTORNEYS

PACKAGE FOR MOUNTING SEMICONDUCTOR DEVICE IN MICROSTRIP LINE

BACKGROUND OF THE INVENTION

1. FIELD OF THE INVENTION

This invention relates to a microstrip line and a package for mounting a semiconductor device in such a microstrip line.

2. DESCRIPTION OF THE PRIOR ART

Microwave circuits or waveguides have heretofore been used for the transmission of radio waves lying in the microwave frequency band and included a semiconductor device mounted therein for the frequency conversion, oscillation, amplification, multiplication and mixing of microwaves. Thus, the semiconductor device had to have a shape suitable for mounting in the waveguide.

However, the microwave circuit has a size which is substantially equivalent to the wavelength of the microwave used for the transmission, and therefore it has a considerable weight and is expensive. In an effort to eliminate the drawback of the microwave circuit while retaining the excellent features of the microwave circuit, a microstrip line has been devised which possesses the excellent features of the microwave circuit and yet is light in weight and not bulky and can be easily manufactured due to the planar shape of the circuit. However, a semiconductor device of the shape suitable for mounting in the microwave circuit has been difficult to be mounted in the microstrip line in the existing shape.

Generally, a semiconductor device for use with radio waves of the microwave or higher frequency band may be of the so-called monolithic type having a plurality of circuit elements provided on a semiconductor pellet. However, in view of the fact that a mixer diode, varactor diode, switching diode, and Gunn diode are principally used for radio waves lying in the microwave frequency band, the so-called hybrid type having such a semiconductor device incorporated in a microstrip line is considered to be quite useful.

Packages preferably used for mounting such a semiconductor device in a high frequency circuit include those of the 1N23 type, prong type and micropill type principally used in a waveguide line or coaxial line. In spite of the recent tendency in which the employment of solid state microwave devices leads to an increased use of strip lines in place of waveguide lines, coaxial lines, etc., the packages of the types above described are unfit for use in the strip line due to the large shape and impedance mismatching. A disc type package is generally used for mounting an integrated circuit operating with a relatively low frequency of less than 3 GHz and is commonly provided with three to twelve pin output terminals. This disc type package is also defective in that a long connection is required for connecting the elements with the wiring due to the large and planar shape resulting in a large lead wire inductance.

SUMMARY OF THE INVENTION

It is an object of the present invention to provide a package for easily replaceably mounting a semiconductor device in a microstrip line.

Another object of the present invention is to provide a hybrid type microstrip line having a required semiconductor device incorporated therein.

In accordance with one aspect of the present invention, there is provided a microstrip line having a first conductive plate, a pair of blocks of dielectric material disposed on said first conductive plate to be spaced apart a predetermined distance from each other in the longitudinally extending direction of said first conductive plate, and at least one second conductive plate disposed on the upper central surface portion of each said dielectric block in parallel with said first conductive plate along the longitudinally extending direction of said first conductive plate, said microstrip line comprising a substrate of electrically insulating material disposed in the space defined between said dielectric blocks and having a central recess for mounting a required semiconductor device therein, a first pair of electrical leads disposed on the upper surface portions of said electrically insulating substrate except said central recess for establishing an electrical connection between said second conductive plates, a second pair of electrical leads for electrically connecting said semiconductor device with said first pair of electrical leads, and a conductive layer disposed on the lower surface of said electrically insulating substrate, the impedance of said electrically insulating substrate and said electrical leads being varied by varying the shape thereof depending on the operating microwave frequency so that said impedance is equal to the impedance of said microstrip line.

The microstrip line according to the present invention is of the hybrid type having a semiconductor device incorporated therein, and the package for mounting the semiconductor device has a structure as above described and is thus very small in size and shape. Further, due to the fact that the impedance of the package portion is equal to that of the microstrip line, undesirable impedance mismatching can be substantially eliminated and a diode as described previously can operate with a microwave in much the same manner as when it is directly connected with the microstrip line. For instance, the input voltage standing ratio (hereinafter to be referred to as VSWR) of a mixer diode cooperating with a Gunn diode local oscillator of 13.0 GHz can be reduced to less than 1.2 with a conversion loss of 4.2 dB, and thus a great improvement can be attained compared with a VSWR of 2.0 generally obtained with a conventional disc type package. The elimination of the impedance mismatching may be attained by suitably varying the thickness and material of the electrically insulating substrate, and the width of the electrical leads. Further, because of the fact that the portion of the electrically insulating substrate mounting the semiconductor device or diode thereon has a small thickness, a high heat radiation efficiency can be obtained thereby reducing the thermal resistance.

DESCRIPTION OF THE PREFERRED EMBODIMENTS

Figures 1, 2A:
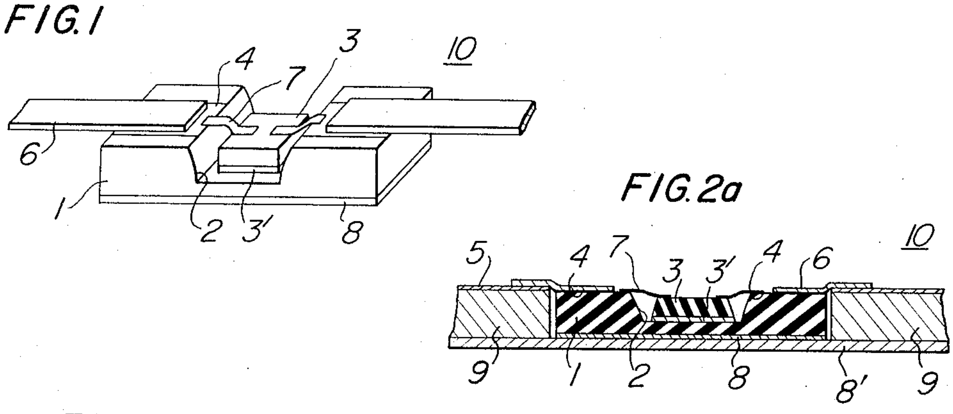
FIG. 1 is a schematic perspective view of a package according to the present invention.
FIG. 2*a* is a schematic sectional view of a microstrip line in which the package mounting a semiconductor device is incorporated.

Referring to FIG. 1, a package 10 comprises a substrate 1 of material such as aluminum oxide 3.0 mm long, 0.5 mm thick and 1.3 mm wide. The substrate 1 is formed with a central recess 2 which is 1.0 mm long, 1.3 mm wide and 0.35 mm deep for mounting a semiconductor device therein. A member 3' of material such as copper is disposed on the upper bottom surface of the central recess 2, and a Schottky barrier mixer diode 3 of, for example, GaAs is disposed on the member 3'.

Figure 2B:
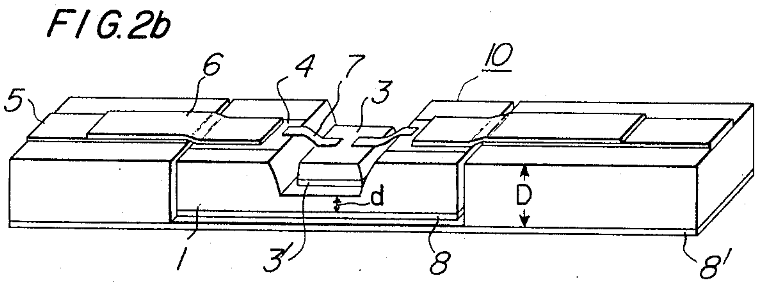
FIG. 2*b* is a schematic perspective view of the microstrip line shown in FIG. 2*a*.

As shown in FIGS. 2*a* and 2*b*, a pair of metal strips 4 are deposited by metalizing the central portion of the upper surface of the aluminum oxide substrate 1 except the central recess 2 so as to extend in the longitudinal direction of the substrate 1. A microstrip line comprises a conductive plate 8', a pair of blocks 9 of dielectric material disposed on the conductive plate 8' to be spaced apart a predetermined distance from each other, and portions of an unbalanced type 50-ohm line 5 disposed on the upper surface of the dielectric blocks 9. A pair of gold-plated planar leads 6 of material such as Kovar 0.5 mm wide and 0.1 mm thick are used to connect the metal strips 4 with the 50-ohm line 5. A pair of electrode leads 7 connect the Schottky barrier mixer diode 3 with the metal strips 4, and a metal layer or conductive layer 8 is deposited on the entire lower surface of the aluminum oxide substrate 1. The width of the leads 6 may be varied depending on the frequency of the microwave so that the impedance of the aluminum oxide substrate 1 and leads is equal to the impedance of the strip line 5. The thickness d of the portion of the aluminum oxide substrate 1 mounting the mixer diode 3 thereon is desirably about one-third of the thickness D of the dielectric blocks 9.

It is preferable that the end surfaces of the aluminum oxide substrate 1 opposite to the corresponding end surfaces of the dielectric blocks 9 are perpendicular with respect to the strip line 5 and are spaced apart a smallest possible distance from the said surfaces of the dielectric blocks 9. Many packages 10 of the kind above described can be easily manufactured by preparing a wafer consisting of, for example, 30 segments and cutting the wafer into individual segments by means of a diamond cutter.

Figure 3A:
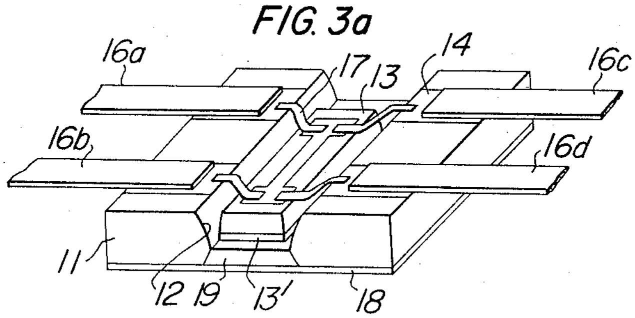
FIG. 3*a* is a schematic perspective view of another form of the package of the present invention mounting a Gun diode logic element therein.
Figure 3B:
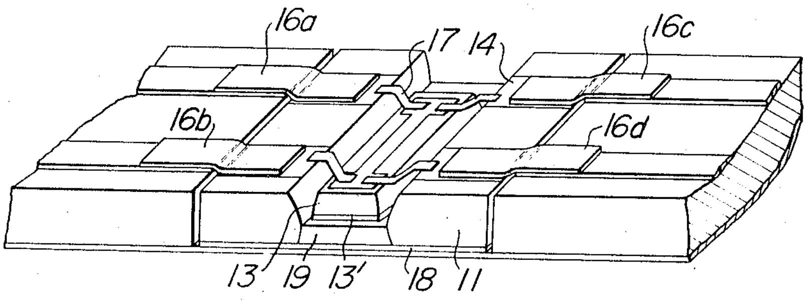
FIG. 3*b* is a perspective view of a microstrip line of the package in which a Gunn diode logic element is mounted.

Another embodiment of the present invention shown in FIGS. 3*a* and 3*b* is generally similar to the preceding embodiment shown in FIGS. 1, 2*a* and 2*b*. Referring to FIGS. 3*a* and 3*b*, a package comprises a substrate 11 of material such as aluminum oxide having a central recess 12. A conductive member 13' is disposed in the recess 12 for mounting thereon a semiconductor device 13 which may be a planar type Gunn diode logic element. Two pairs of metal strips 14 are deposited on the upper surface, except the central recess 12, of the aluminum oxide substrate 11 which is provided at its lower surface with a conductive layer 18. Two pairs of leads 16*a*, 16*b*, 16*c* and 16*d* are disposed on the corresponding metal strips 14, and electrode leads 17 connect the Gunn diode 13 with the leads 16*a*, 16*b*, 16*c* and 16*d*. The leads 16*a* and 16*d* are used for applying drive current pulses of the order of ns, while the leads 16*b* and 16*c* are used for applying a control signal in the form of trigger pulses. The portion 19 underlying the bottom of the central recess 12 of the aluminum oxide substrate 11 is made of a high heat conductor such as oxygen-free copper or Berylia ceramics so that it acts as a heat radiator. When the diode logic element 13 is operated for switching operation, undesirable reflexion due to impedance mismatching can be reduced and the pulses of the ns order can be easily controlled. Further, the thermal resistance can be reduced to a minumum by virtue of the provision of the heat radiator 19.

It will be understood from the above description that the present invention provides a package for mounting a semiconductor device which package is quite small in size and can easily eliminate undesirable impedance mismatching by simply varying the shape of the substrate and electrical leads. Thus, a semiconductor element can be mounted in a microstrip line without any loss of its operating characteristics and the thermal resistance can be remarkably reduced. The package is further advantageous in that it can be easily manufactured.

We claim:

1. A package for mounting a semiconductor device in a microstrip line comprising a substrate of electrically insulating material having a single central recess for mounting the semiconductor device therein, at least one pair of metal strips disposed respectively only on the upper surface portions of said electrically insulating substrate except said central recess, at least one pair of substantially planar electrical leads partially disposed on the portions of and partially extending beyond said at least one pair of metal strips respectively, at least one pair of electrical leads for electrically connecting the semiconductor device with said at least one pair of metal strips respectively, and a conductive layer disposed on the lower surface of said electrically insulating substrate.

2. A microstrip line having a first conductive plate, a pair of planar blocks of dielectric material disposed on said first conductive plate to be spaced apart a predetermined distance from each other in the longitudinally extending direction of said first conductive plate, at least one pair of second conductive plates disposed respectively on the upper surface portions of said dielectric blocks in parallel with said first conductive plate, a substrate of electrically insulating material disposed in the space defined between said dielectric blocks and having a single central recess, a required semiconductor device mounted in said central recess, at least one pair of metal strips disposed respectively only on the upper surface portions of said electrically insulating substrate except said central recess, at least one pair of substantially planar electrical leads partially disposed on the portions of said at least one pair of metal strips respectively and partially connected electrically on the portions of at least one pair of second conductive plates respectively, at least one pair of electrical leads for electrically connecting said semiconductor device with said at least one pair of metal strips respectively, and a conductive layer disposed on the lower surface of said electrically insulating substrate, the width and thickness of said substantially planar electrical leads being so selected that the impedance of said substantially planar electrical leads and said electrically insulating substrate is equal to the impedance of said microstrip line at the operating microwave frequency.

3. A microstrip line according to claim 2, wherein the thickness of said electrically insulating substrate on which said semiconductor device is mounted is about one-third of the thickness of said dielectric blocks.

4. A microstrip line according to claim 2, wherein the portion of said electrically insulating substrate on which said semiconductor device is mounted is made of a high heat conductor.

5. A microstrip line according to claim 2, wherein said semi-conductor device is a device operating at a frequency of not less than 3GHz.

6. A package for mounting a semiconductor device in a microstrip line comprising:

a substrate of electrically insulating material having a single recess for mounting the semiconductor device therein;

at least one pair of metal strips disposed respectively only on the upper surface portions of said electrically insulating substrate except said recess;

at least one pair of substantially planar electrical leads partially disposed on the portions of and partially extending beyond said at least one pair of metal strips, respectively; and at least one pair of electrical leads for electrically connecting the semiconductor device with said at least one pair of metal strips, respectively.

7. A microstrip line having a first conductive plate;

a pair of planar blocks of dielectric material disposed on said first conductive plate to be spaced apart a predetermined distance from each other;

at least one pair of second conductive plates disposed respectively on the upper surface portions of said dielectric blocks;

a substrate of electrically insulating material disposed in the space defined between said dielectric blocks and having a single recess;

a required semiconductor device mounted in said recess;

at least one pair of metal strips disposed respectively only on the upper surface portions of said electrically insulating substrate;

at least one pair of substantially planar electrical leads partially disposed on the portions of said at least one pair of metal strips respectively and partially connected electrically on the portions of said at least one pair of second conductive plates, respectively; and at least one pair of electrical leads for electrically connecting said semiconductor device with said at least one pair of metal strips, respectively.

8. A microstrip line according to claim 7, wherein the width and thickness of said substantially planar electrical leads is so selected that the impedance of said substantially planar electrical leads and said electrically insulating substrate is equal to the impedance of said microstrip line at the operating microwave frequency.

9. A microstrip line according to claim 7, wherein the portion of said electrically insulating substrate on which said semiconductor device is mounted is made of a high heat conductor.

10. A microstrip line according to claim 7, wherein said semiconductor device is a device operating at a frequency of not less than 3 GHz.

11. A microstrip line according to claim 2, wherein the upper surfaces of said at least one pair of metal strips are of substantially the same height as the upper surfaces of said at least one pair of second conductive plates.

12. A microstrip line according to claim 7, wherein the upper surfaces of said at least one pair of metal strips are of substantially the same height as the upper surfaces of said at least one pair of second conductive plates.

* * * * *